United States Patent [19]

Boskamp et al.

[11] Patent Number: 4,943,775
[45] Date of Patent: Jul. 24, 1990

[54] MAGNETIC RESONANCE APPARATUS WITH UNCOUPLED RF COILS

[75] Inventors: Eddy B. Boskamp, Shelton, Conn.; Wilhelmus R. M. Mens, Eindhoven, Netherlands

[73] Assignee: U.S. Philips Corporation, New York, N.Y.

[21] Appl. No.: 339,030

[22] Filed: Apr. 14, 1989

Related U.S. Application Data

[63] Continuation-in-part of Ser. No. 117,003, Nov. 14, 1987, Pat. No. 4,859,947.

[30] Foreign Application Priority Data

Nov. 27, 1986 [NL] Netherlands .......................... 8603006
Apr. 20, 1988 [NL] Netherlands .......................... 8801018

[51] Int. Cl.⁵ ............................................. G01R 33/20
[52] U.S. Cl. .................................. 324/322; 324/318
[58] Field of Search ............... 324/300, 307, 309, 318, 324/322

[56] References Cited

U.S. PATENT DOCUMENTS

| 4,816,765 | 3/1989 | Boskamp | 324/322 |
| 4,839,595 | 6/1989 | Boskamp | 324/318 |
| 4,859,947 | 8/1989 | Boskamp | 324/318 |

Primary Examiner—Michael J. Tokar
Attorney, Agent, or Firm—Jack D. Slobod

[57] ABSTRACT

In a magnetic resonance apparatus with an rf detection coil system constructed from overlapping coils the extent of overlap has been chosen to be so that the mutual inductance between overlapping coils is restricted to a non-disturbing minimum by flux compensation. As a result of this the coils of the cascade can be operated simultaneously for the measurement of coronal and sagittal slices without detrimental mutual influence.

21 Claims, 2 Drawing Sheets

MAGNETIC RESONANCE APPARATUS WITH UNCOUPLED RF COILS

RELATED APPLICATION

This application is a continuation-in-part of application Ser. No. 117,003, filed Nov. 14, 1987 one of the same inventors as herein which issued on Aug. 22, 1989 as U.S. Pat. No. 4,859.957.

BACKGROUND OF THE INVENTION

The invention relates to a magnetic resonance apparatus having a magnet system for generating a steady magnetic field, a coil system for generating gradient fields, an rf transmitter coil and an rf coil system with coils overlapping each other partly for the detection of magnetic resonance signals generated in an object.

Such an apparatus is described in the aforementioned parent application. In the apparatus described therein the restriction is experienced that also when surface coils are used which overlap each other partly in the direction of width for the signal detection the extent of an object to be measured in one series is restricted by the width dimension of each of the coils individually. Measured in the longitudinal direction of the coils an area corresponding to the full width of the coil system can be measured in one series by rapidly switching to a subsequent coil, but cross-sections in the width direction can be composed therefrom only via signal processing in which, for example, a great redundance of measured data has to be stored and the measuring time is thus adversely influenced.

SUMMARY OF THE INVENTION

It is the object of the invention to remove this restriction and for that purpose a magnetic resonance apparatus of the type mentioned in the opening paragraph is characterized according to the invention that coils overlapping each other are proportioned so and overlap each other to such an extent that mutual induction therebetween is reduced to a non-disturbing low level.

Since successive coils in the rf coil system according to the invention overlap each other to such an extent that no disturbing mutual induction occurs, the coils are uncoupled and measurement can be carried out with each of the coils activated simultaneously so that measurement can be carried out over the full width of the coil system in one series in a direction over the overlapping area or the direction exceeding the overlapping areas.

In a preferred embodiment coils overlapping each other are constructed as surface coils which are preferably situated in a common plane and of which, for example, one is rigidly connected to a support and a subsequent coil or subsequent coils can be moved with respect to the rigidly connected one until an optimum overlap has been reached after which the coil can be fixed in the said position.

The optimum overlap can be computed for each coil but may also be established empirically. In particular a first coil is rigidly connected to a rigid support and a second coil is rigidly connected to a rigid slide which can be moved in the holder.

In a further preferred embodiment coils overlapping each other are constructed so that in the optimum overlap a minimum of coil conductor overlap occurs as a result of which the capacitive coupling is minimized. In particular one of the coils is at least two times the conductor width shorter than a subsequent coil as a result of which only two crossing overlaps in the conductors occur.

In a further preferred embodiment one or several of the overlapping coils is or are constructed as butterfly coils as a result of which for a given width of a coil system a smaller number of coils will suffice and an automatic uncoupling with the transmitter field is realized. Butterfly coils as such are described in EP-A-8720301.5 corresponding to the aforementioned parent application. The invention will now be described in greater detail with reference to a few embodiments according to the invention and with reference to a drawing, in which:

DETAILED DESCRIPTION OF THE PREFERRED EMBODIMENTS

Figure 1:
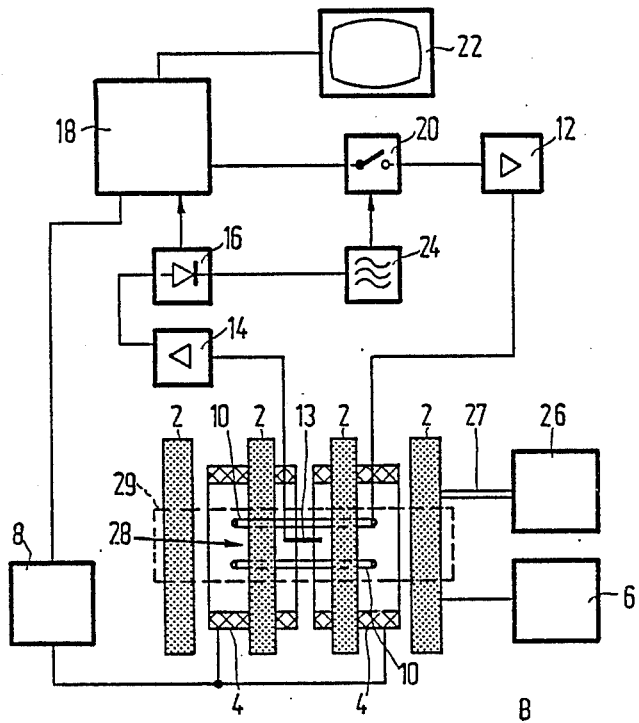
FIG. 1 shows a magnetic resonance apparatus equipped with an rf coil system according to the invention.

A magnetic resonance apparatus as shown in FIG. 1 comprises a magnet system 2 for generating a steady uniform magnetic field, a magnet system 4 for generating magnet gradient fields, power supply sources 6 and 8 for the magnet system 2 and the magnet system 4, respectively. A magnet coil 10 for generating an rf magnetic alternating field is connected to an rf source 12. A surface coil 13 is provided for the detection of magnetic resonsnce signals generated by the rf transmitter field in an object to be examined. For reading, the coil 13 is connected to a signal amplifier 14. The signal amplifier 14 is connected to a phase-sensitive rectifier 16 which is connected to a central control device 18. The central control device 18 also controls a modulator 20 for the rf source 12, the supply source 8 for the gradient coils, and a monitor 22 for display. A high frequency oscillator 24 controls the modulator 20 as well as the phase-sensitive rectifier 16 which processes the measured signals. For coupling, if any, there is provided a cooling device 26 which comprises cooling ducts 27. A cooling device of this kind can be constructed as a water cooling system for resistance coils or as a liquid nitrogen or helium dewar system for superconducting coils. The transmitter coil 10 which is arranged within the magnet systems 2 and 4 encloses a measurement space 28 which offers sufficient room for a patient for medical diagnostic measurement. Thus, in the measurement space 28 there can be generated a steady magnetic field, gradient fields for position selection of slices to be imaged, and a spatially uniform rf alternating field. The measurement space is shielded against interference fields by a Faraday cage 29.

In accordance with the invention, within the measurement space 28 there is arranged a cascade of surface coils 32 so that all cross-sections of the object, in as far as covered by the measurement space 28, can be measured with a suitable signal-to-noise ratio without any displacement of the object of coils being required. In a measurement space in which, for example, sufficiently exactly defined gradient fields and a sufficiently spatial uniform transmission field can be generated over a length of 50 cm, measurement can be carried out by means of a cascade of surface coils having a dimension of, for example, 20×20 cm. In a configuration of this kind the coils of the cascade overlap each other in the direction of width. The extent of overlap has been chosen to be so that mutual inductance between the two coils is minimized by it. In practical cases it has been found that this occurs with an overlap of, for example, 4 cm. Using this configuration and measurement method, cross-sections in the longitudinal direction are provided by one and the same coil. This is achieved with at most the additional condition of the possibility of measurement of a transitional cross-section by two successive coils. Therefore, nothing in the measurement method need be changed in comparison with customary methods, other than a preferably rapid electronic switch over to the next coil which is sychronized with the position of the cross-section to be measured.

Figures 2, 3:
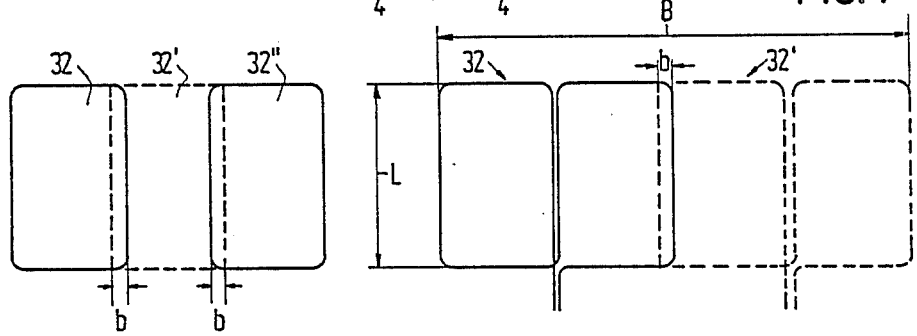
FIGS. 2, 3 and 4 are preferred embodiments of coil systems

A feasible cascade system is diagrammatically shown in FIG. 2 which shows successive coils 32 which overlap each other over a distance b of, for example, 4 cm. In addition to the uncoupling of the measuring coils, during the active period of a transmitter coil as described in EP 164164, the geometry and the overlap ensure that no undesired cross-talk occurs beweeen coils of the cascade. Transversal slices can be measured with an overlap which is not optimized for uncoupling using electronic uncoupling. If the overlap is optimized in this sense, sagittal and coronal slices can also be measured with a sufficient extent by simultaneously using the coils overlapping each other.

FIG. 3 shows a cascade of butterfly coils according to the invention in which two successive coils 32 are arranged so that the desired overlap b occurs for the wings as a result of which the coils are mutually uncoupled.

Figure 4:
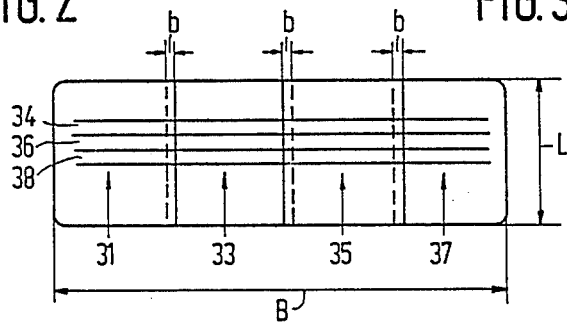

In a cascade as shown in FIG. 4 signals from coils 31, 33, 35 and 37 overlapping each other differently are used for measuring sagittal or coronal cross-sections by supplying these signals, optionally after pre-amplification, to an rf signal processing device, for signal adding and for supplying a single signal for picture formation to a signal receiver. By adapting the extent of overlap to a minimum mutual coupling, measurement can be carried out with all the coils simultaneously so that the sagittal or coronal image planes can extend over the full width of the cascade, by combining the data obtained from the individual coils, and the advantage of the favourable signal-to-noise ratio for transversal images is maintained. As regards the signal-to-noise ratio the sagittal and coronal images are equal to a single 20×60 cm² coil.

Figure 5:
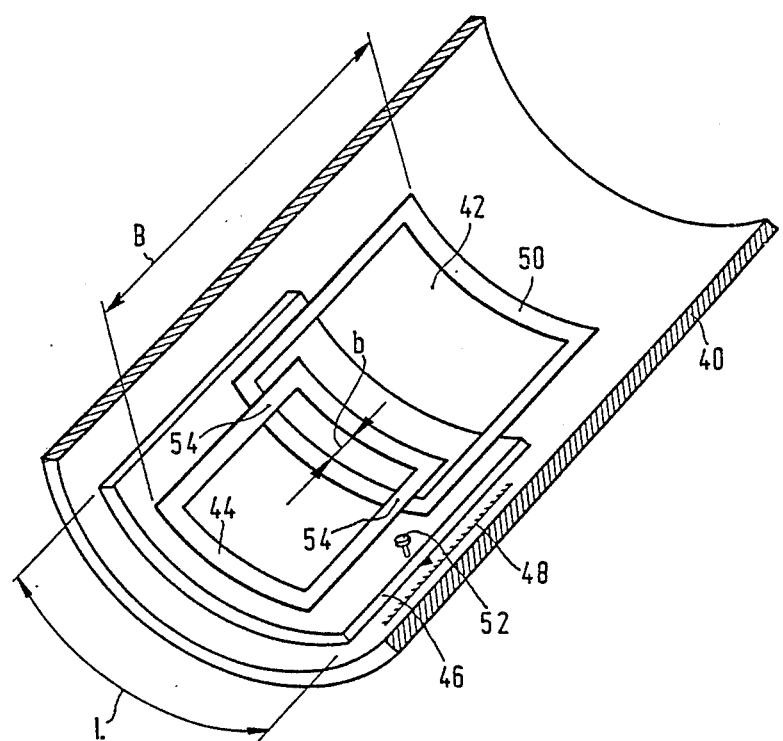
FIG. 5 is a perspective view of an embodiment of a coil having an adjustable overlap.

The coil shown in FIG. 5 comprises a rigid support 40 which can be rigidly mounted to, for example, a patient table or in the magnetic resonance apparatus.

A first coil 42 is rigidly connected to the support 40 and consists, for example, of copper tape 50 having a thickness of 0.1 mm and a width of 5 mm bonded to the support. A second coil 44 is bonded to a rigid slide 46 in a corresponding manner and can be moved in a direction B so that both coils can be made to have an overlap b. By means of a measuring ruler 48, for example, an optimum overlap b once fixed can be established. By means of a clamping device 52 the slide can be fixed in the desired position with respect to the support 40. The slide is preferably constructed so that both coils are situated substantially in one plane but remain electrically insulated.

By making the second coil 44 shorter than the first coil measured in a longitudinal direction L of the coils, or conversely, overlap occurs for the current conductors 50 at the area of crossings 54 so that mutual capacitive coupling is restricted to a negligible minimum.

We claim:

1. A magnetic resonance apparatus comprising a magnet system for generating a steady magnetic field, coil system for generating a gradient field, an rf transmitter coil and an rf coil system having coils overlapping each other partly for detection of magnetic resonance signals generated in an object, characterized in that successive detection coils overlap each other over such an area that mutual inductance between overlapping coils is reduced to a non-disturbing minimum.

2. A magnetic resonance apparatus as claimed in claim 1, characterized in that the overlapping coils are surface coils which are situated substantially in one common-plane.

3. A magnetic resonance apparatus as claimed in claim 1 characterized in that the overlapping coils are mounted with respect to each other so as to be movable.

4. A magnetic resonance apparatus as claimed in claim 1, characterized in that one of the overlapping coils is rigidly provided in a rigid support and a second is mounted on a rigid slide which can be moved in the support.

5. A magnetic resonance apparatus as claimed in claim 1, characterized in that the geometry of current conductors of mutually overlapping coils ensures a minimum mutual capacitive coupling.

6. A coil system for magnetic resonance apparatus comprising successive coils which overlap each other by an extent of overlap between coils which is adjustable in order to restrict the mutual inductance between overlapping coils to a non-disturbing minimum.

7. A magnetic resonance imaging apparatus comprising: magnet systems for generating a steady magnetic field and gradient magnetic fields, and an rf surface coil system carried by a surface for placement alongside an object for detecting magnetic resonance signals to be generated in said object, wherein said rf surface coil system comprises a cascade of individually operatively selectable surface coils having similar parts corresponding to each other, corresponding parts of each succesive coil in said cascade being offset along said surface from those of the preceding surface coil in said cascade in such a manner that successive coils overlap each other, the amount of overlap of being chosen to enable an iamge to be formed, without gaps, from data obtained from operative use of a plurality of said surface coils, while producing only a non-disturbing minimum of cross-talk between said plurality of said surface coils where others are operatively selected simultaneously.

8. A magnetic resonance apparatus as claimed in claim 2, characterized in that the overlapping coils are mounted with respect to each other so as to be movable.

9. A magnetic resonance apparatus as claimed in claim 2, characterized in that one of the overlapping coils is rigidly provided in a rigid support and a second is mounted on a rigid slide which can be moved in the support.

10. A magnetic resonance apparatus as claimed in claim 3, characterized in that one of the overlapping coils is rigidly provided in a rigid support and a second is mounted on a rigid slide which can be moved in the support.

11. A magnetic resonance apparatus as claimed in claim 8, characterized in that one of the overlapping coils is rigidly provided in a rigid support and a second is mounted on a rigid slide which can be moved in the support.

12. A magnetic resonance apparatus as claimed in claim 2, characterized in that the geometry of current conductors of mutually overlapping coils ensures a minimum mutual capacitive coupling.

13. A magnetic resonance apparatus claim in claim 3, characterized in that the geometry of current conductors of mutually overlapping coils ensures a minimum mutual capacitive coupling.

14. A magnetic resonance apparatus as claimed in claim 4, characterized in that the geometry of current conductors of mutually overlapping coils ensures a minimum mutual capacitive coupling.

15. A magnetic resonance apparatus as claimed in claim 8, characterized in that the geometry of current conductors of mutually overlapping coils ensures a minimum mutual capacitive coupling.

16. A magnetic resonance apparatus as claimed in claim 11, characterized in that the geometry of current conductors of mutually overlapping coils ensures a minimum mutual capacitive coupling.

17. A coil system as claimed in claim 6, characterized in that the overlapping coils are surface coils which are situated substantially in one common-plane.

18. A magnetic resonance apparatus as claimed in claim 6, characterized in that the overlapping coils are mounted with respect to each other so as to be movable.

19. A magnetic resonance apparatus as claimed in claim 6, characterized in that one of the overlapping coils is rigidly provided in a rigid support and a second is mounted on a rigid slide which can be moved in the support.

20. A magnetic resonance apparatus as claimed in claim 18, characterized in that one of the overlapping coils is rigidly provided in a rigid support and a second is mounted on a rigid slide which can be moved in the support.

21. A magnetic resonance apparatus as claimed in claim 6, characterized in that the geometry of current conductors of mutually overlapping coils ensures a minimum mutual capacitive coupling.

* * * * *